United States Patent
Lee et al.

(10) Patent No.: US 7,565,925 B2
(45) Date of Patent: Jul. 28, 2009

(54) HEAT DISSIPATION DEVICE

(75) Inventors: Hsieh-Kun Lee, Fullerton, CA (US); Cheng-Tien Lai, Fullerton, CA (US); Zhi-Bin Tan, Fullerton, CA (US)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 823 days.

(21) Appl. No.: 11/166,966

(22) Filed: Jun. 24, 2005

(65) Prior Publication Data

US 2006/0289150 A1    Dec. 28, 2006

(51) Int. Cl.
*H05K 7/20* (2006.01)
(52) U.S. Cl. .................... 165/104.33; 257/715; 361/700
(58) Field of Classification Search ............ 165/104.21, 165/104.33; 257/715; 361/700
See application file for complete search history.

(56) References Cited

U.S. PATENT DOCUMENTS

| 6,542,364 | B2* | 4/2003 | Lai et al. ............... | 165/104.33 |
| 6,779,595 | B1  | 8/2004 | Chiang | |
| 6,785,140 | B2  | 8/2004 | Artman et al. | |
| 7,013,960 | B2* | 3/2006 | Lee et al. ............... | 165/104.33 |
| 7,110,259 | B2* | 9/2006 | Lee et al. ............... | 361/700 |
| 2003/0141041 | A1* | 7/2003 | Chen ...................... | 165/104.33 |
| 2004/0226697 | A1  | 11/2004 | Liu | |
| 2005/0098304 | A1* | 5/2005 | Lin et al. ............... | 165/104.33 |
| 2006/0104032 | A1* | 5/2006 | Lee et al. ............... | 361/700 |

* cited by examiner

*Primary Examiner*—Leonard R Leo

(57) ABSTRACT

A heat dissipation device includes a heat sink (10) and at least a serpent heat pipe (22). The heat sink (10) comprises a base (12) contacting with an electrical component, a heat dissipation fins group (14) secured to the base (12) and a cover (16) attached to a top of the heat dissipation fins group (14). The heat dissipating fins group (14) defines a notch (148) at one side thereof. Two end portions of the heat pipe (22) are respectively connected to the base (12) and the cover (16), and a middle portion of the heat pipe (22) is accommodated in the notch (148).

20 Claims, 4 Drawing Sheets

HEAT DISSIPATION DEVICE

BACKGROUND

1. Field

The present invention relates generally to a heat dissipation device, and more particularly to a heat dissipation device using heat pipes for enhancing heat removal from heat-generating components.

2. Prior Art

As computer technology continues to advance, electronic components such as central processing units (CPUs) of computers are being made to provide faster operational speeds and greater functional capabilities. When a CPU operates at high speed in a computer enclosure, its temperature can increase greatly. It is desirable to dissipate the heat quickly, for example by using a heat dissipation device attached to the CPU in the enclosure. This allows the CPU and other electronic components in the enclosure to function within their normal operating temperature ranges, thereby assuring the quality of data management, storage and transfer.

A conventional heat dissipation device comprises a heat sink and at least a pair of heat pipes. The heat sink comprises a base and a plurality of fins extending from the base. The base defines two grooves in the top surface thereof, and bottom surface of the base is attached to an electronic component. Each heat pipe has an evaporating portion accommodated in one of the grooves and a condensing portion inserted in the top fins. The base absorbs heat produced by the electronic component and transfers heat directly to the fins through the heat pipes. By the provision of the heat pipes, heat dissipation efficiency of the heat dissipation device is improved.

However, due to structural limitation, the contact area between the heat pipes and the fins is limited, which results in that the heat removal efficiency by the prior art heat dissipation device still cannot meet the increasing heat removing requirement for the up-to-the minute heat-generating electronic devices.

SUMMARY OF THE INVENTION

What is needed is a heat dissipation device with heat pipes which has an improved heat dissipation efficiency.

A heat dissipation device in accordance with a preferred embodiment of the present invention comprises a heat sink and at least one serpent heat pipe. The heat sink comprises a base contacting with an electrical component, a heat dissipation fins group extending from the base and a cover attached to the heat dissipation fins group. The heat dissipating fins group defines a notch at one side thereof. Evaporating and condensing portions of the at least one serpent heat pipe are respectively connected to the base and the cover, and a middle portion of the heat pipe is accommodated in the notch and thermally engages with the heat dissipating fins group.

Other objects, advantages and novel features of the invention will become more apparent from the following detailed description when taken in conjunction with the accompanying drawings, in which:

DETAILED DESCRIPTION OF THE INVENTION

Figure 1:
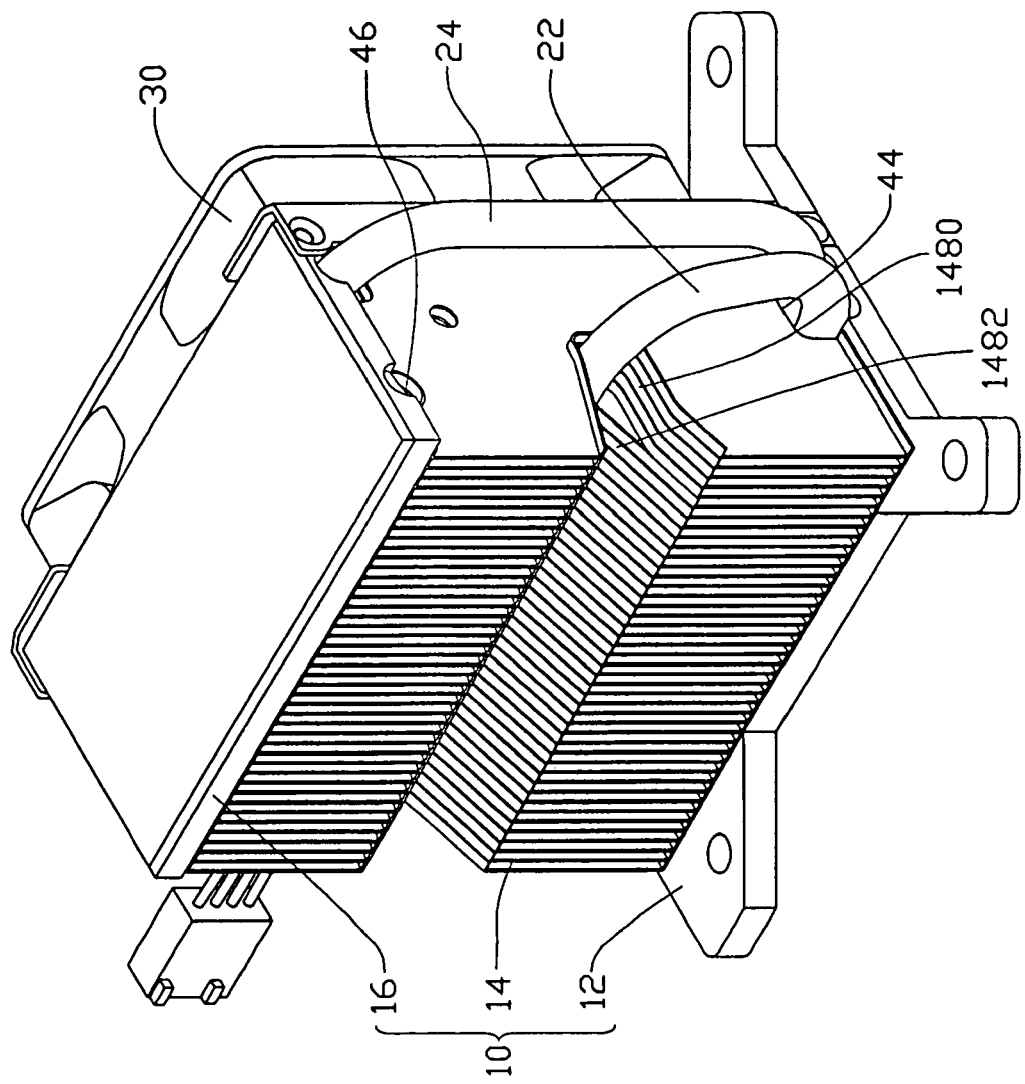
FIG. 1 is an assembled view of a heat dissipation device in accordance with a preferred embodiment of the present invention.

FIG. 1 shows a heat dissipation device in accordance with a preferred embodiment of the present invention. The heat dissipation device comprises a heat sink 10, heat pipes 22, 24 and a fan assembly 30 located beside the heat sink 10.

Figure 2:
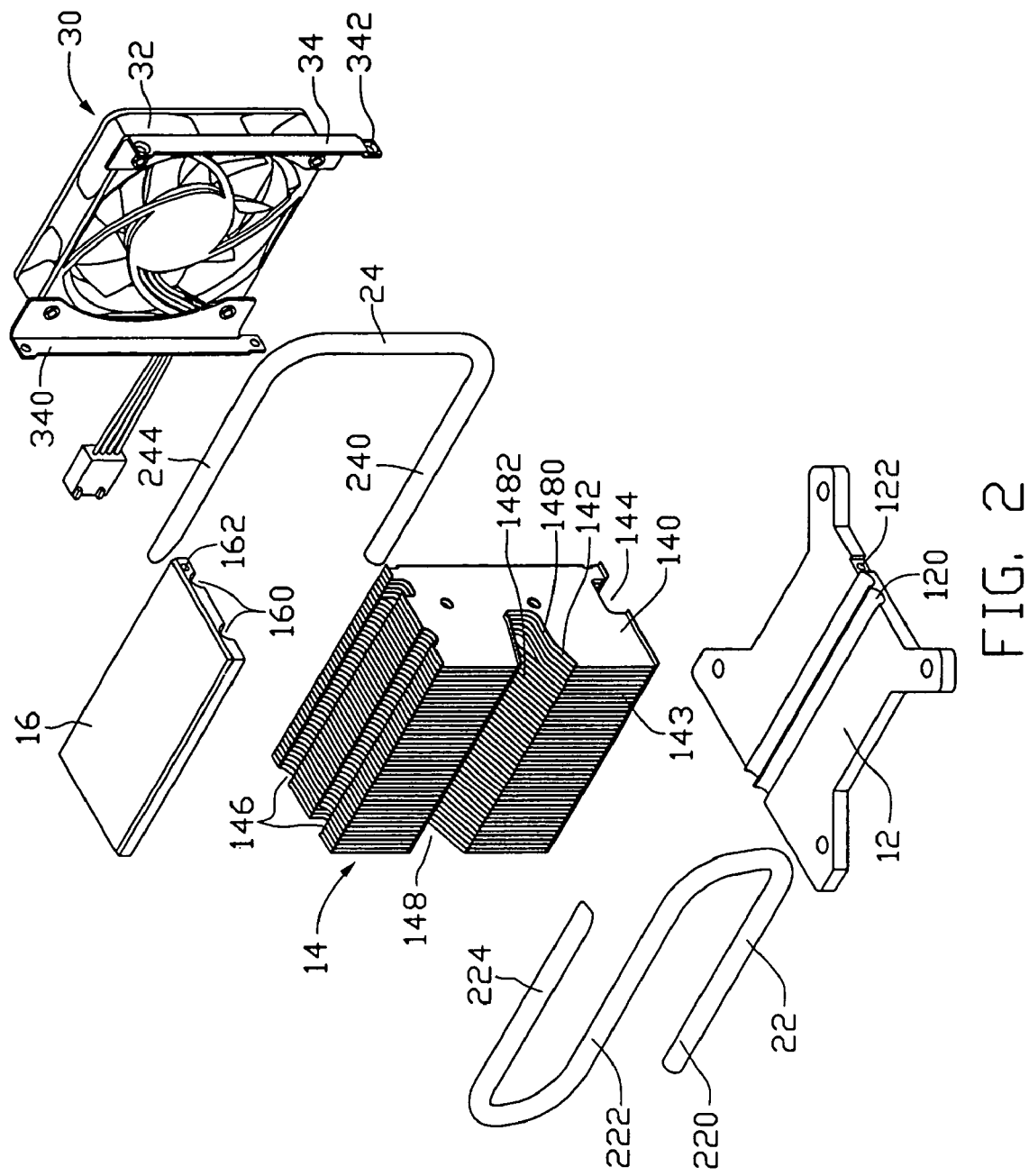
FIG. 2 is an exploded view of FIG. 1.
Figure 3:
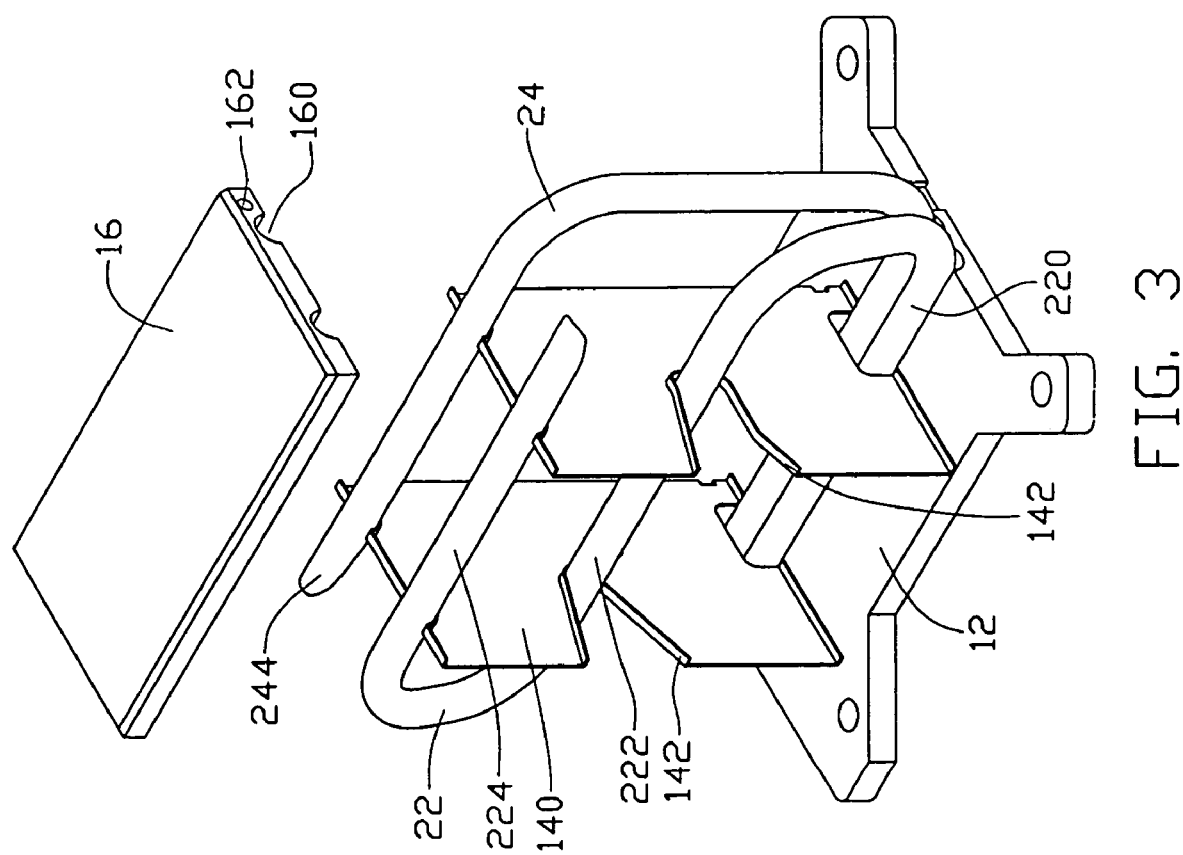
FIG. 3 is a view similar to FIG. 1 with some parts thereof removed to more clearly show relationship between heat pipes and heat dissipation fins of the heat dissipation device.

Referring to FIGS. 2-3, the heat sink 10 comprises a base 12, a cover 16 spaced opposite to the base 12, and a heat dissipating fins group 14 sandwiched between the base 12 and the cover 16. The base 12 has a bottom surface for being attached to an electrical component (not shown) and a top surface opposite to the bottom surface. The base 12 defines a pair of first grooves 120 in the top surface and a pair of first screw holes 122 at a pair of opposite sides thereof. The cover 16 defines a pair of second grooves 160 on a bottom surface thereof and a pair of second screw holes 162 at a pair of opposite sides thereof. The heat dissipating fins group 14 comprises a plurality of spaced heat dissipating fins 140. The spaced heat dissipating fins 140 define a plurality of air passageways 143 therebetween. Each heat dissipation fin 140 defines a cutout at a side thereof (see FIG. 3). An abutting flange 142 laterally extends from the heat dissipation fin 140 around the cutout for contacting the heat pipe 22. The cutouts together form a notch 148 at a side of the heat dissipating fins group 14. The notch 148 comprises a first section 1480 and a second section 1482 along the lateral direction wherein the first section 1480 adjacent to a right side of the heat dissipation device as seen from FIG. 1, and is shorter than the second section 1482 along the lateral direction. Furthermore, the first section 1480 has an inner portion that is larger than that of the second section, thereby facilitating mounting of the heat pipe 22 in the notch 148. A bottom surface of the heat dissipating fins group 14 defines a first channel 144 corresponding to the first grooves 120. The first channel 144 cooperates with the first grooves 120 to form a first passage 44. A top surface of the heat dissipating fins group 14 defines a pair of second channels 146 corresponding to the second grooves 160. Each second channel 146 cooperates with a corresponding second groove 160 to form a second passage 46. The heat pipe 22 is S-shaped and the heat pipe 24 is U-shaped. The heat pipe 22 comprises three parallel heat-exchange portions, namely a first parallel-portion 220, a second parallel-portion 222 and a third parallel-portion 224. The first parallel-portion 220 and the third parallel-portion 224 are respectively accommodated in a corresponding first groove 120 and a corresponding second groove 160 by means of soldering. An upper turning corner of a connecting-portion between the first parallel-portion 220 and the second parallel-portion 222 is accommodated in the first section 1480. The second parallel-portion 222 is inserted in the second section 1482 and is soldered to and thermally contacts with the flanges 142. The U-shaped heat pipe 24 comprises an evaporating portion 240 and a condensing portion 244. The evaporating portion 240 and the condensing portion 244 are respectively accommodated in corresponding first and second grooves 120, 160. The fan assembly 30 comprises a fan 32 and a fan holder 34. The fan holder 34 has a pair of flanges 340 on a pair of opposite sides thereof. Each flange 340 defines holes 342 corresponding to the first, second screw holes 122,162. Screws (not shown) are used to extend through the holes 342 and screwed into the screw holes 122, 162, whereby the fan assembly 30 is attached to a rear side of the heat dissipating fins group 14. An airflow generated by the fan 32 flow through the air passageways 143 to take heat away therefrom. In the present invention, the cover 16 is soldered to a top surface of the heat dissipating fins group 14 and the base is soldered to a bottom surface of the heat dissipating fins group 14. The first-parallel portion 220 of the S-shaped heat pipe 22 and the evaporating portion 240 of the U-shaped heat pipe 24 are soldered in the first grooves 120 and the first channel 144 so that the portions 220, 240 are thermally connected with the base 12 and the heat dissipating fin group 14. The third-parallel portion 224 of the S-shaped heat pipe 22 and the condensing portion 244 of the U-shaped heat pipe 24 are soldered in the second grooves 160 and the second channels 144 so that the portions 224, 244 are thermally connected with the cover 16 and the heat dissipating fin group 14.

Figure 4:
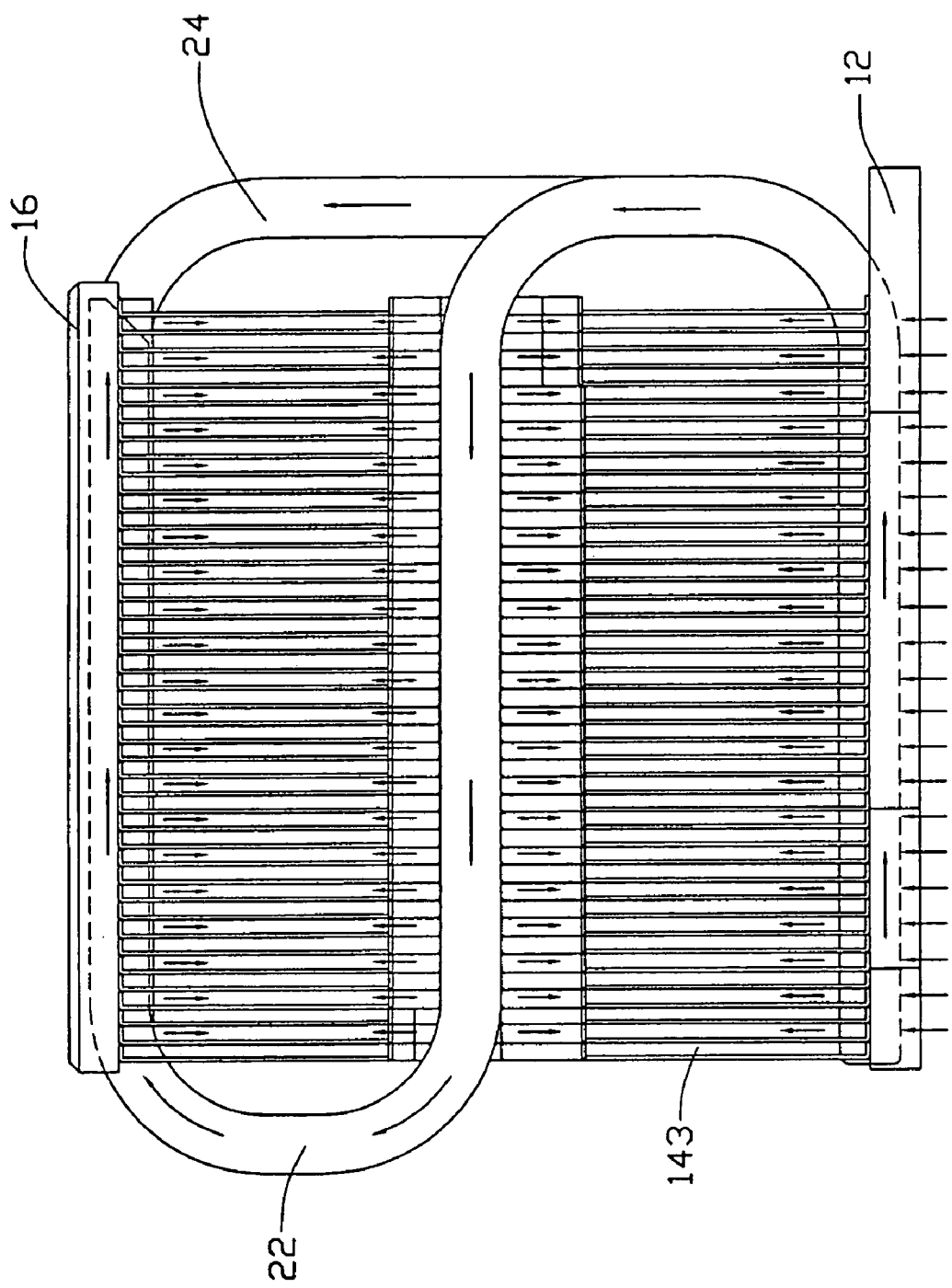
FIG. 4 is a side view of FIG. 1, showing heat transferring paths of the heat dissipation device.

Referring to FIG. 4, heat transferring paths of the heat dissipation device are shown, the base 12 absorbs heat and a major part of the heat is directly transferred to the first parallel-portion 220 of the heat pipe 22 and the evaporating portion 240 of the heat pipe 24. The first parallel-portion 220 is an evaporating portion of the heat pipe 22. A minor part of the heat is conducted upwardly through the fins 140. The major part of the heat received by the heat pipes 22, 24 causes liquid in the portions 220, 240 thereof to evaporate into vapor. The vapor flows upwardly as shown by arrows in the heat pipes 22, 24. Following the upward movement of the vapor, the major part of the heat is transmitted to the fins 140 in contact with the heat pipes 22, 24. Finally the vapor is condensed into liquid in the condensing portion 244 and the third-parallel portion 224 (which is a condensing portion of the heat pipe 22) and returns to the first-parallel portion 220 and the evaporating portion 240 of the heat pipes 22, 24 along wick structures of the heat pipes 22, 24.

In the present invention, by the use of the S-shaped and U-shaped heat pipes 22, 24, and the specially designed heat dissipating fins group 14, the contacting areas between the heat pipes 22, 24 and the fins 140 are significantly increased, whereby heat transferred by the heat pipes 22, 24 can be more efficiently taken away, thereby meeting the requirement of heat dissipation of up-to-the minute electronic devices.

It is understood that the invention may be embodied in other forms without departing from the spirit thereof. Thus, the present examples and embodiments are to be considered in all respects as illustrative and not restrictive, and the invention is not to be limited to the details given herein.

We claim:

1. A heat dissipation device comprising:
   at least one heat pipe; and
   a heat sink comprising a base, a heat dissipation fins group extending from the base, and a cover contacting with the heat dissipation fins group, the heat dissipation fins group defining a notch at one side thereof, two end portions of the at least one heat pipe respectively contacting with the base and the cover, a middle portion of the heat pipe being accommodated in the notch;
   wherein said notch comprises a first section and a second section, the first section shorter than the second section along a lateral direction, the first section having an inner portion larger than that of the second section for accommodating a turning corner of a connection section of the at least one heat pipe connecting the middle portion and the end portion contacting with the base.

2. The heat dissipation device as claimed in claim 1, wherein the end portions and the middle portion are parallel to each other.

3. The heat dissipation device as claimed in claim 1, further comprising a U-shaped heat pipe.

4. The heat dissipation device as claimed in claim 1, wherein said heat dissipation fins group comprises a plurality of heat dissipation fins, each heat dissipation fin defining a cutout at one side thereof, the cutouts cooperatively defining the notch.

5. The heat dissipation device as claimed in claim 1, wherein said base defines a pair of first grooves, one of the first grooves accommodating the end portion of the at least one heat pipe contacting with the base, said heat dissipation fins group defining a first channel corresponding to the first grooves to form a first passage.

6. The heat dissipation device as claimed in claim 5, wherein the cover defines a pair of second grooves, one of the second grooves accommodating the end portion of the at least one heat pipe contacting with the cover, said heat dissipation fins group defining a pair of second channels, each second channel cooperating with a corresponding second groove to form a second passage.

7. The heat dissipation device as claimed in claim 5, further comprising a U-shaped heat pipe which comprises an evaporating portion accommodated in the other of the first grooves and a condensing portion accommodated in the other of the second grooves.

8. The heat dissipation device as claimed in claim 1, further comprising a fan assembly at one side of the heat dissipation fins group opposite to the side defining the notch therein.

9. A heat dissipation device comprising:
   a base;
   a cover parallel to the base;
   a fin member sandwiched between the base and the cover, the fin member defining a plurality of air passageways and a cavity extending perpendicularly to the air passageways; a serpentine heat pipe passing through the cavity and thermally connecting the base and the cover;
   wherein the serpentine heat pipe comprises three parallel heat-exchange portions, respectively orderly sandwiched between the base and the fin member, thermally received in the cavity and sandwiched between the cover and the fin member.

10. The heat dissipation device as claimed in claim 9, wherein the fin member forms a plurality of flanges at the cavity, the flanges being in thermally contacting with the heat pipe.

11. The heat dissipation device as claimed in claim 9, wherein the cavity is in communication with an exterior at a side of the fin member.

12. The heat dissipation device as claimed in claim 9, further comprising a fan arranged at a side thereof distant from the cavity.

13. The heat dissipation device as claimed in claim 12, further comprising a fan holder securely engaged with the base and the cover, for facilitating to hold the fan.

14. The heat dissipation device as claimed in claim 9, further comprising a U-shaped heat pipe having an absorbing-portion and an exhausting-portion, the absorbing-portion being connected with the base, the exhausting-portion being connected with the cover.

15. The heat dissipation device as claimed in claim 14, wherein the base comprises a pair of first grooves respectively accommodating the absorbing-portion and the parallel heat-exchange portion.

16. The heat dissipation device as claimed in claim 14, wherein the cover comprises a pair of second grooves respectively accommodating the exhausting-portion and the parallel heat-exchange portion.

17. A heat dissipation device for an electronic device, comprising:
- a base for contacting with the electronic device;
- a heat dissipating fins group soldered to the base;
- a serpent heat pipe having an evaporating portion soldered to the base and the heat dissipating fins group, a middle portion soldered to the heat dissipating fins and a condensing portion soldered to the heat dissipating fins group, wherein the middle portion is parallel to the evaporating portion and the condensing portion; and
- a U-shaped heat pipe having an evaporating portion soldered to the base and the heat dissipating fins group and a condensing portion soldered to the heat dissipating fins group.

18. The heat dissipation device of claim 17, wherein the heat dissipating fins group defines a notch and the middle portion of the serpent heat pipe is inserted into the notch.

19. The heat dissipation device of claim 18 further comprising a cover soldered to a top surface of the heat dissipating fins group, the condensing portions of the serpent heat pipe and the U-shaped heat pipe being soldered to the cover.

20. The heat dissipation device of claim 19 further comprising an electrical fan for generating a forced airflow through the heat dissipating fins group.

* * * * *